(12) United States Patent
Sokolik et al.

(10) Patent No.: US 7,449,742 B2
(45) Date of Patent: Nov. 11, 2008

(54) MEMORY DEVICE WITH ACTIVE LAYER OF DENDRIMERIC MATERIAL

(75) Inventors: Igor Sokolik, East Boston, MA (US); Juri Krieger, Brookline, MA (US); Xiaobo Shi, Woburn, MA (US); Richard Kingsborough, Acton, MA (US); William Leonard, Brookline, MA (US)

(73) Assignee: Spansion LLC, Sunnyvale, CA (US)

( * ) Notice: Subject to any disclaimer, the term of this patent is extended or adjusted under 35 U.S.C. 154(b) by 57 days.

(21) Appl. No.: 11/642,477

(22) Filed: Dec. 20, 2006

(65) Prior Publication Data
US 2008/0152934 A1 Jun. 26, 2008

(51) Int. Cl.
*H01L 27/108* (2006.01)
*H01L 29/76* (2006.01)
*H01L 29/94* (2006.01)
*H01L 31/119* (2006.01)
*H01L 29/788* (2006.01)
*H01L 29/792* (2006.01)

(52) U.S. Cl. .......... 257/310; 257/314; 257/315; 257/316; 257/317; 257/318; 257/319; 257/320; 257/321; 257/322; 257/323; 257/324; 257/325; 257/326; 257/906; 257/907; 257/908

(58) Field of Classification Search ......... 257/314–326, 257/906–908
See application file for complete search history.

(56) References Cited

U.S. PATENT DOCUMENTS

| | | | | |
|---|---|---|---|---|
| 6,806,526 B2 * | 10/2004 | Krieger et al. | ............... | 257/296 |
| 6,844,128 B2 * | 1/2005 | Hsu et al. | ................. | 430/200 |
| 6,864,522 B2 * | 3/2005 | Krieger et al. | ............... | 257/296 |
| 7,276,322 B2 * | 10/2007 | Bellmann et al. | ........... | 430/200 |
| 2005/0186443 A1 * | 8/2005 | Marrocco et al. | ........... | 428/690 |
| 2007/0105285 A1 * | 5/2007 | Kusumoto et al. | .......... | 438/151 |

* cited by examiner

*Primary Examiner*—Ida M Soward

(57) ABSTRACT

The present memory device includes first and second electrodes, a passive layer between the first and second electrodes; and an active layer between the first and second electrodes, the active layer being of dendrimeric material which provides passages through the active layer.

6 Claims, 2 Drawing Sheets

MEMORY DEVICE WITH ACTIVE LAYER OF DENDRIMERIC MATERIAL

BACKGROUND OF THE INVENTION

1. Technical Field

This invention relates generally to memory devices, and more particularly, to a memory device with improved data retention.

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory devices. Each memory device can be accessed or "read", "written", and "erased" with information. The memory devices maintain information in an "off" or an "on" state, also referred to as "0" and "1". Typically, a memory device is addressed to retrieve a specified number of byte(s) (e.g., 8 memory devices per byte). For volatile memory devices, the memory devices must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of mil lions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies.

FIG. 1 illustrates a type of memory device 30, which includes advantageous characteristics for meeting these needs. The memory device 30 includes an electrode 32 (for example copper), a copper sulfide layer 34 on the electrode 32, an active layer 36, for example a copper oxide layer, on the layer 34, and an electrode 38 (for example titanium) on the active layer 36. Initially, assuming that the memory device 30 is unprogrammed, in order to program the memory device 30, ground is applied to the electrode 38, while a positive voltage is applied to electrode 32, so that an electrical potential $V_{pg}$ (the "programming" electrical potential) is applied across the memory device 30 from a higher to a lower electrical potential in the forward direction of the memory device 30 (see FIG. 2, a plot of memory device current vs. electrical potential applied across the memory device 30). This potential is sufficient to cause copper ions to be attracted from the layer 34 toward the electrode 38 and into the active layer 36 (A) so that conductive filaments are formed, causing the active layer 36 (and the overall memory device 30) to be in a (forward) low-resistance or conductive state. Upon removal of such potential (B), the ions drawn into the active layer 36 during the programming step remain therein, so that the active layer 36 (and memory device 30) remain in a conductive or low-resistance state.

In the read step of the memory device 30 in its programmed (conductive) state, an electrical potential $V_r$ (the "read" electrical potential) is applied across the memory device 30 from a higher to a lower electrical potential in the forward direction of the memory device 30. This electrical potential is less than the electrical potential $V_{pg}$ applied across the memory device 30 for programming (see above). In this situation, the memory device 30 will readily conduct current, which indicates that the memory device 30 is in its programmed state.

In order to erase the memory device, a positive voltage is applied to the electrode 38, while the electrode 32 is held at ground, so that an electrical potential $V_{er}$ (the "erase" electrical potential) is applied across the memory device 30 from a higher to a lower electrical potential in the reverse direction of the memory device 30. This potential is sufficient to cause copper ions to be repelled from the active layer 36 toward the electrode 32 and into the layer 34 (C), causing the active layer 36 (and the overall memory device 30) to be in a high-resistance or substantially non-conductive state. This state remains upon removal of such potential from the memory device 30.

In the read step of the memory device 30 in its erased (substantially non-conductive) state, the electrical potential $V_r$ is again applied across the memory device 30 from a higher to a lower electrical potential in the forward direction of the memory device 30, as described above. With the active layer 36 (and memory device 30) in a high-resistance or substantially non-conductive state, the memory device 30 will not conduct significant current(L2), which indicates that the memory device 30 is in its erased state.

It will be understood that it is highly desirable that the memory device, when programmed, be capable of retaining its programmed state for a long period of time, i.e., until it is desired that the state be changed to its erased state. Likewise, it is highly desirable that the memory device, when erased, be capable of retaining that state for a long period of time as chosen. While the above described device is effective in operation, it has been found that over a period of time, the conductive filaments formed in the programmed device can break down, causing the conductivity of the memory device to be significantly reduced, so that the memory device undesirably loses its programmed state. It will be understood that it is desirable for the device to be capable of stably retaining its programmed and erased states as desired.

DISCLOSURE OF THE INVENTION

Broadly stated, the present memory device comprises first and second electrodes, a passive layer between the first and second electrodes; and an active layer between the first and second electrodes, the active layer comprising material containing dendrimerics that provides for multiple ion capture points and may also facilitate ion motion in the active layer.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Figure 1:
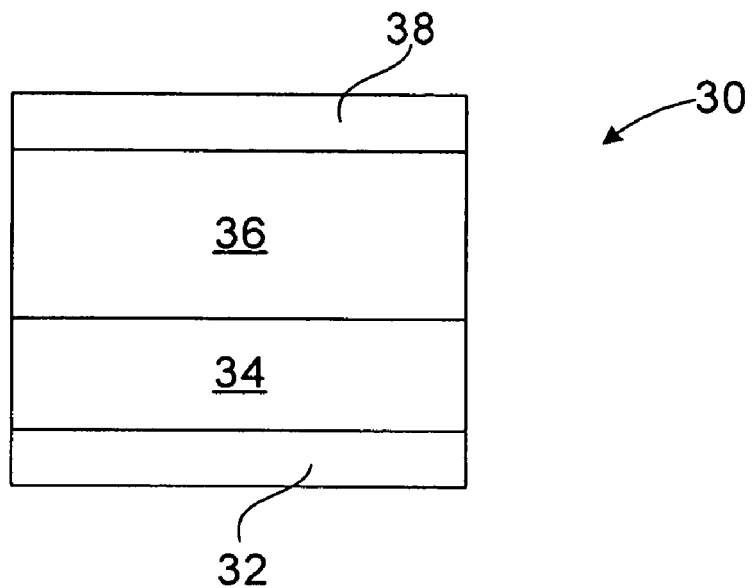
FIG. 1 is a cross-sectional view of an above-described memory device.
Figure 2:
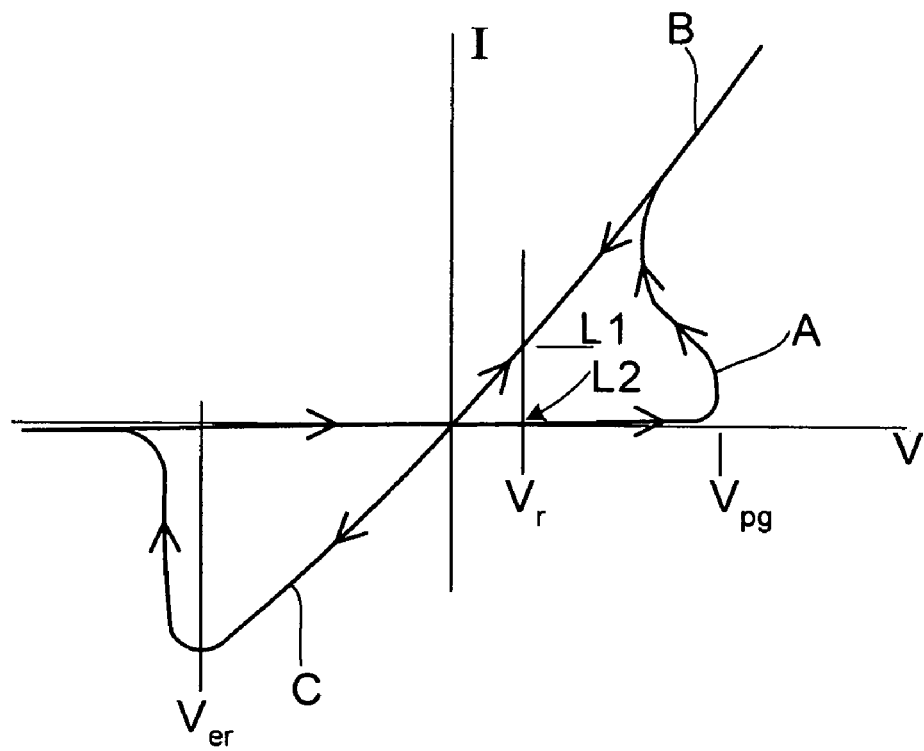
FIG. 2 is a plot of current vs. voltage illustrating operating characteristics of the memory device of FIG. 1.
Figure 3:
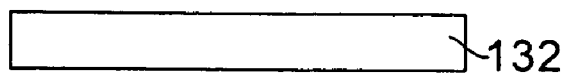
FIGS. 3-6 illustrate method steps in fabricating embodiments of the present invention.
Figure 4:
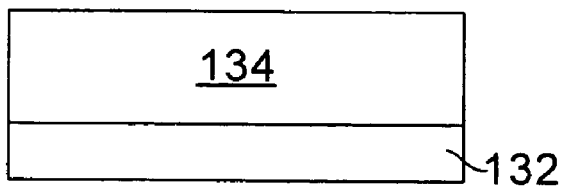

FIGS. 3-6 illustrate a process for fabricating embodiments of memory element 130 in accordance with the present invention. Initially, an electrode 132 is provided (FIG. 3). The electrode 132 may be formed by any suitable technique, such as physical vapor deposition, i.e. PVD (such as thermal vacuum evaporation, e-beam deposition or sputtering), ion plating, chemical vapor deposition, i.e. CVD (such as metal-organic CVD, i.e. MOCVD), plasma-enhanced CVD, i.e. PECVD, and the like. The electrode 132 in this embodiment is copper, but it will be understood that the electrode 132 can be formed of any of a number of materials including aluminum, barium, calcium, chromium, cobalt, copper, germanium, gold, magnesium, manganese, molybdenum, indium, iron, nickel, palladium, platinum, ruthenium, samarium, silver, tantalum, titanium, tungsten, zinc, metal oxides, polysilicon, doped amorphous silicon, metal silicide, metal carbide, metal nitrides, magnesium-silver alloy, nickel-cobalt alloy, iron-nickel-cobalt alloy, iron-nickel alloy, nickel-copper alloy, and nickel-chromium alloy. Next, a passive layer 134, in this embodiment copper sulfide, is formed over, on and in contact with the electrode 132 (FIG. 4). Examples of other conductivity facilitating compounds that may constitute the passive layer 134 include one or more of copper sulfide ($Cu_xS$, $1 \leq x \leq 2$), copper rich copper sulfide, copper oxide (CuO, $Cu_2O$), copper selenide ($Cu_xSe$, $1 \leq x \leq 2$), copper telluride ($Cu_2Te$, CuTe), manganese oxide ($MnO_2$), titanium dioxide ($TiO_2$), indium oxide ($I_2O_3$), silver sulfide ($Ag_xS$, $1 \leq x \leq 2$), gold sulfide ($Au_2S$, AuS), iron oxide ($Fe_3O_4$), cobalt arsenide ($CoAs_2$), nickel arsenide (NiAs), mixtures thereof, and the like. The conductivity facilitating compounds do not necessarily dissociate into ions under the strength of the electric field, although ions may move through them. The passive layer may contain two or more subpassive layers, each sublayer containing the same, different, or multiple conductivity facilitating compounds.

Figure 5:
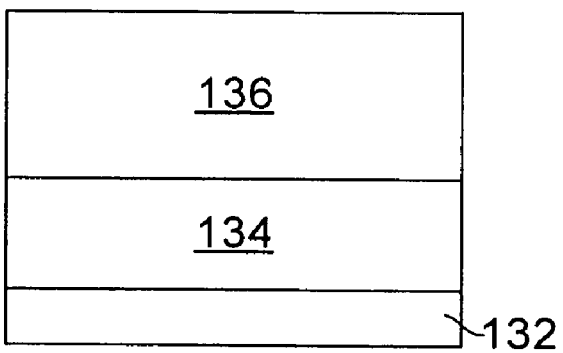

Then, an active layer 136 is provided on, over and in contact with the passive layer 134 (FIG. 5). The active layer 136 is of conjugated dendrimeric polymer material, possessing conjugated and adjacent delocalized π-electrons. Examples of such dendrimeric materials are: n-type polyphenyl vinylene isoquinoline, phenyl vinyline-2,2'-bithionyl and dendrimeric polyphenyl vinylene. The structure of the G2-12Q dendrimer, based on benzene core, poly(phenylenevinylene) dendrons, and diphenylquinoline peripheral groups is illustrated below.

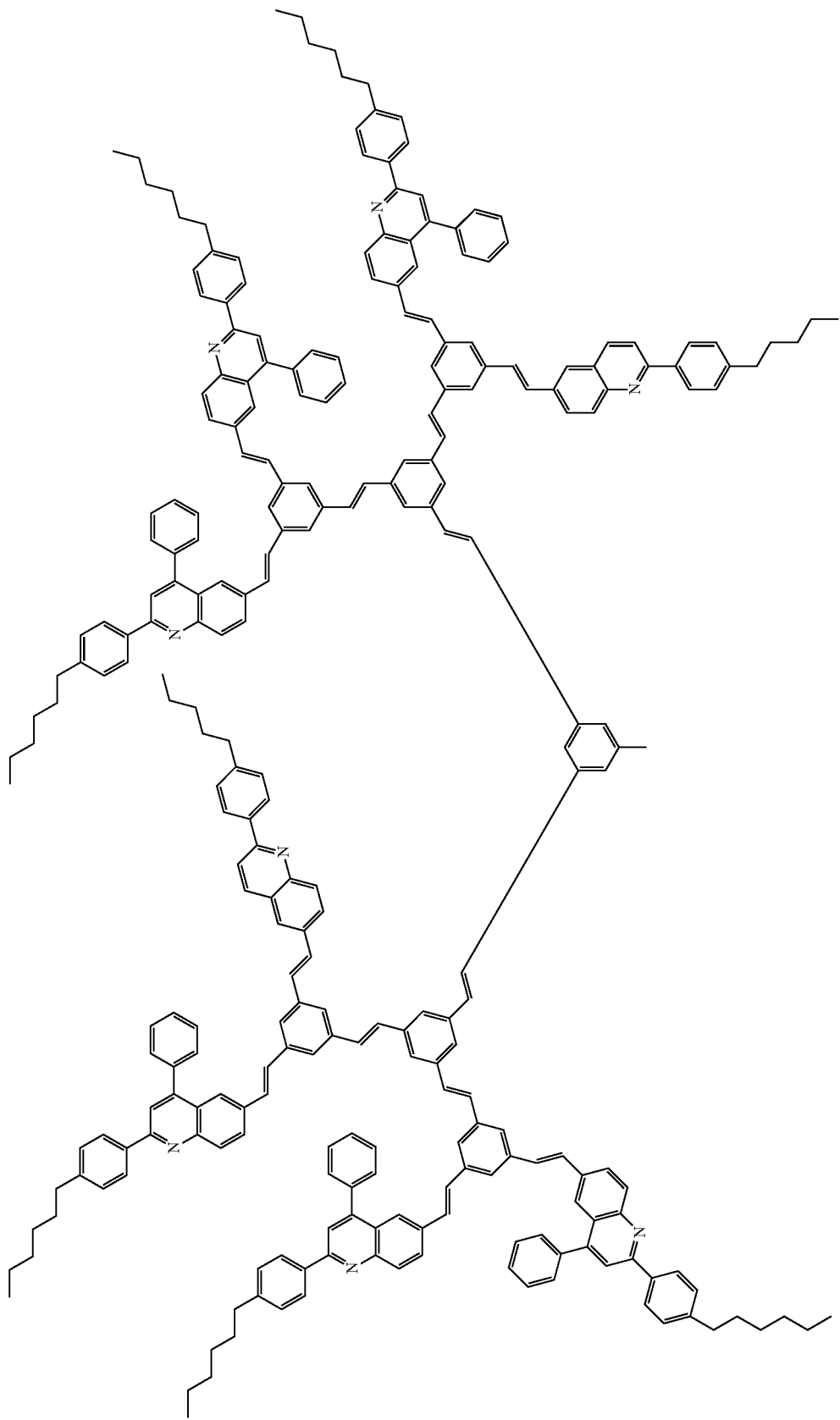

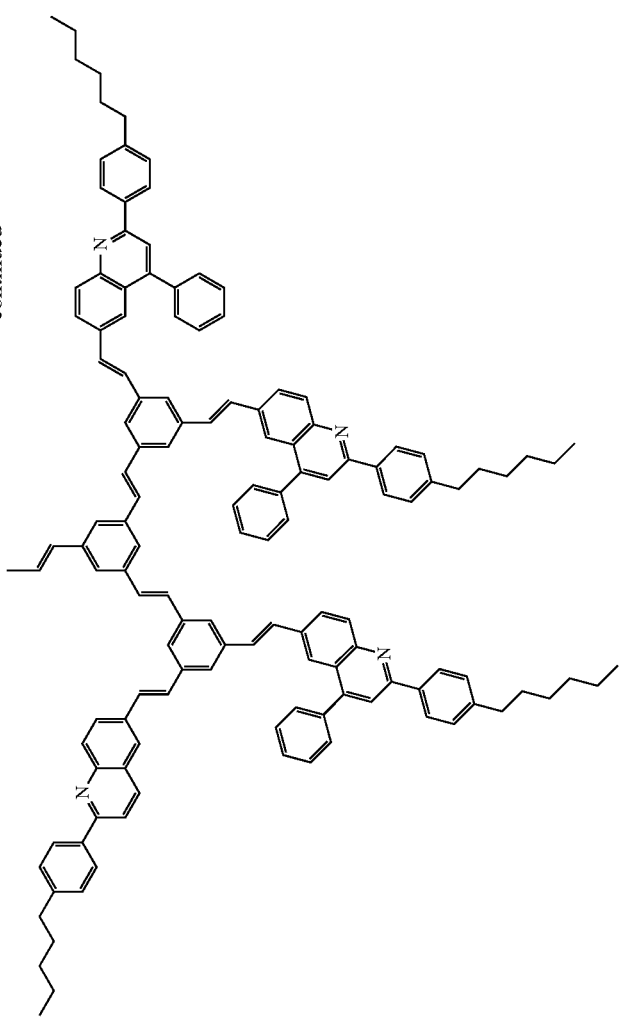

Many of these conjugated dendrimeric materials contain organic molecular groups that can be used to capture metal doping ions from the adjacent passive layer 134. Examples of such materials are 2,2'-bithionyl and isoquinoline.

Any of these materials can be applied over the passive layer 134 using spin-on techniques to produce a thin layer with thickness ranged between 100-2000 angstroms. This spin-on step provides uniform coverage of elements thereunder. It will be understood that other materials, organic or inorganic, may also be used. If low concentration of dendrimers is required, inert matrix material is added to the denrimeric material solution and the spin-on step provides a uniform film of dendrimeric material in the inert matrix. Examples of such matrices include but not limited to such polymers as polystyrene, polyvinyl alcohol, and polymethylmatacrylate.

Figure 6:
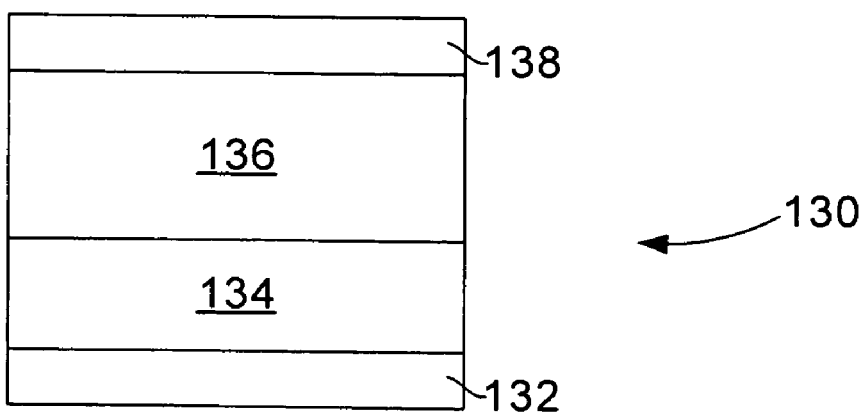

Then, an electrode 138 is formed to a desired thickness on, over and in contact with the active layer 136 (FIG. 6). The electrode 138 in this embodiment is titanium, but it will be understood that the electrode 138 may be formed of any the materials listed with regard to electrode 132, and may be formed by the techniques listed with regard to electrode 132.

FIG. 6 illustrates the fabricated memory element 130, wherein the layers 134, 136 are formed between the electrodes 132, 138.

The memory element 130 is programmed, erased, and read in a manner similar to that previously described. However, it has been found that when copper (or other metal) ions are provided into the active layer 136, the copper (or other metal) ions readily travel into the active layer 136 by means of electric-field-induced diffusion (i.e., electromigration), so that programming is properly achieved. Furthermore, with the dendrimers in the material being randomly oriented and able to capture doped metal ions, retention of the ions within the active layer 136 in the programmed state is greatly improved, providing for a stable programmed state. Additionally, reversible chemical reaction of the ions with the dendrimeric chemical structure enhances retention of the ions in the active layer. This overcomes the problem described above, wherein in certain situations, metal ions (such as copper ions) undesirably move from the active layer 136, in turn undesirably reducing the conductivity of the active layer 136 and causing degradation or failure of performance.

It will be seen that the above-discussed problems of the prior art are overcome. This is achieved by providing an active layer in accordance with the above description.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory device comprising:
   first and second electrodes;
   a passive layer between the first and second electrodes; and
   an active layer between the first and second electrodes, the active layer comprising material containing dendrimeric material.

2. The memory device of claim 1 wherein the active layer comprises conjugated organic dendrimeric material.

3. The memory device of claim 2 wherein the active layer comprises n-type polyphenyl vinylene isoquinoline.

4. The memory device of claim 2 wherein the active layer comprises phenyl vinyline-2,2'-bithionyl.

5. The memory device of claim 2 wherein the active layer comprises dendrimeric polyphenyl vinylene.

6. The memory device of claim 2 wherein the passive layer comprises copper sulfide.

* * * * *